US012575157B2

(12) United States Patent
Vega et al.

(10) Patent No.: US 12,575,157 B2
(45) Date of Patent: Mar. 10, 2026

(54) NANOSHEET WITH DUAL ISOLATION REGIONS SEPARATED BY BURIED INNER SPACER

(71) Applicant: International Business Machines Corporation, Armonk, NY (US)

(72) Inventors: Reinaldo Vega, Mahopac, NY (US); Ruilong Xie, Niskayuna, NY (US); Shogo Mochizuki, Mechanicville, NY (US); Julien Frougier, Albany, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 678 days.

(21) Appl. No.: 18/050,560

(22) Filed: Oct. 28, 2022

(65) Prior Publication Data

US 2024/0145578 A1 May 2, 2024

(51) Int. Cl.
H01L 29/66 (2006.01)
H01L 21/8238 (2006.01)
(Continued)

(52) U.S. Cl.
CPC ......... H10D 64/018 (2025.01); H10D 30/014 (2025.01); H10D 30/43 (2025.01); H10D 30/6735 (2025.01); H10D 30/6757 (2025.01); H10D 62/115 (2025.01); H10D 62/121 (2025.01); H10D 64/015 (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/017; H10D 64/018; H10D 64/021; H10D 64/151; H10D 84/013; H10D 84/0158; H10D 84/0167; H10D 84/017; H10D 84/0188; H10D 84/0193;

(Continued)

(56) References Cited

U.S. PATENT DOCUMENTS 9,947,804 B1    4/2018  Frougier et al.
10,103,238 B1   10/2018  Zang et al.
(Continued)

FOREIGN PATENT DOCUMENTS

TW    I864786 B    12/2024
TW    I867552 B    12/2024

OTHER PUBLICATIONS

Anonymous, "Method for Providing a STI Top-Off Scheme to Separate Gate from Substrate on Nanosheet Structures", IPCOM000259612D, Aug. 27, 2019, 6p.
(Continued)

*Primary Examiner* — David C Spalla
(74) *Attorney, Agent, or Firm* — CANTOR COLBURN LLP; Kimberly Zillig

(57) ABSTRACT

Embodiments of the invention include a transistor comprising a gate region and a source/drain region. A first isolation layer is under the gate region. A second isolation layer is separated from the first isolation layer by a third isolation layer.

24 Claims, 17 Drawing Sheets

(51) Int. Cl.

| | |
|---|---|
| *H01L 27/092* | (2006.01) |
| *H01L 29/06* | (2006.01) |
| *H01L 29/423* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 64/017* (2025.01); *H10D 64/021* (2025.01); *H10D 84/0167* (2025.01); *H10D 84/0188* (2025.01); *H10D 84/038* (2025.01); *H10D 84/85* (2025.01)

(58) Field of Classification Search
CPC .. H10D 84/038; H10D 84/834; H10D 84/835; H10D 84/85
See application file for complete search history.

(56) References Cited

U.S. PATENT DOCUMENTS

| | | | |
|---|---|---|---|
| 10,204,904 | B2 | 2/2019 | Zang et al. |
| 10,256,158 | B1 | 4/2019 | Frougier et al. |
| 10,388,732 | B1 | 8/2019 | Frougier et al. |
| 10,741,639 | B2 | 8/2020 | Loubet et al. |
| 10,833,191 | B2 | 11/2020 | Frougier et al. |
| 10,840,329 | B1 | 11/2020 | Xie et al. |
| 10,903,315 | B2 | 1/2021 | Loubet et al. |
| 10,937,860 | B2 | 3/2021 | Bi et al. |
| 10,998,234 | B2 | 5/2021 | Xie et al. |
| 11,183,558 | B2 | 11/2021 | Yeh et al. |
| 11,189,713 | B2 | 11/2021 | Xie et al. |
| 11,222,979 | B2 | 1/2022 | Miao et al. |
| 11,245,036 | B1 | 2/2022 | Chen et al. |
| 2015/0084130 | A1 | 3/2015 | Yin et al. |
| 2018/0308986 | A1 | 10/2018 | Chao et al. |
| 2020/0044087 | A1 | 2/2020 | Guha et al. |
| 2020/0294998 | A1 | 9/2020 | Lilak et al. |
| 2021/0028312 | A1 | 1/2021 | Drowley et al. |
| 2022/0231020 | A1 | 7/2022 | Frougier et al. |
| 2023/0178420 | A1 | 6/2023 | He et al. |
| 2023/0260908 | A1* | 8/2023 | Yeoh ................. H01L 21/76897 257/347 |
| 2024/0006479 | A1* | 1/2024 | Yu ......................... H10D 64/018 |
| 2024/0145238 | A1 | 5/2024 | Vega et al. |

OTHER PUBLICATIONS

Anonymous, "Nanosheet Dielectric Isolation through Self-Aligned Directional Process", IPCOM000253327D, ip.com, Mar. 22, 2018, 8p.

Cao, "Bottom Dielectric Isolation To Suppress Sub-Fin Parasitic Channel of Vertically-Stacked Horizontal Gate-All-Around Si Nanosheets Devices", 2022 China Semiconductor Technology International Conference, IEEE Xplore, 2022; 3p.

List of IBM Patents or Patent Applications Treated as Related; Date Filed: Oct. 31, 2022, 2 pages.

Vega, "Nanosheet With Graded Silicon Germanium Layer Under Isolation Region and With Buried Tapered Inner Spacer", U.S. Appl. No. 18/050,554, filed Oct. 28, 2022.

Zhang, "Full Bottom Dielectric Isolation to Enable Stacked Nanosheet Transistor for Low Power and High Performance Applications", IEEE Xplore, 2019, 4p.

The State Intellectual Property Office of People's Republic of China, " Office Action," Aug. 28, 2024, 7 Pages, CN Application No. 112120022.

Taiwan Patent Office, "Notice of Allowance," Oct. 29, 2024, 6 p. TW Application No. 112120007.

* cited by examiner

100

100

100

402

112

110

108

106

104

602

502

502

102

100

1000

FRONT SIDE

BACKSIDE

1000

FRONT SIDE

BACKSIDE

1000

FRONT SIDE

BACKSIDE

1000

FRONT SIDE

BACKSIDE

1000

FRONT SIDE

BACKSIDE

1000

FRONT SIDE

BACKSIDE

1000

FRONT SIDE

BACKSIDE

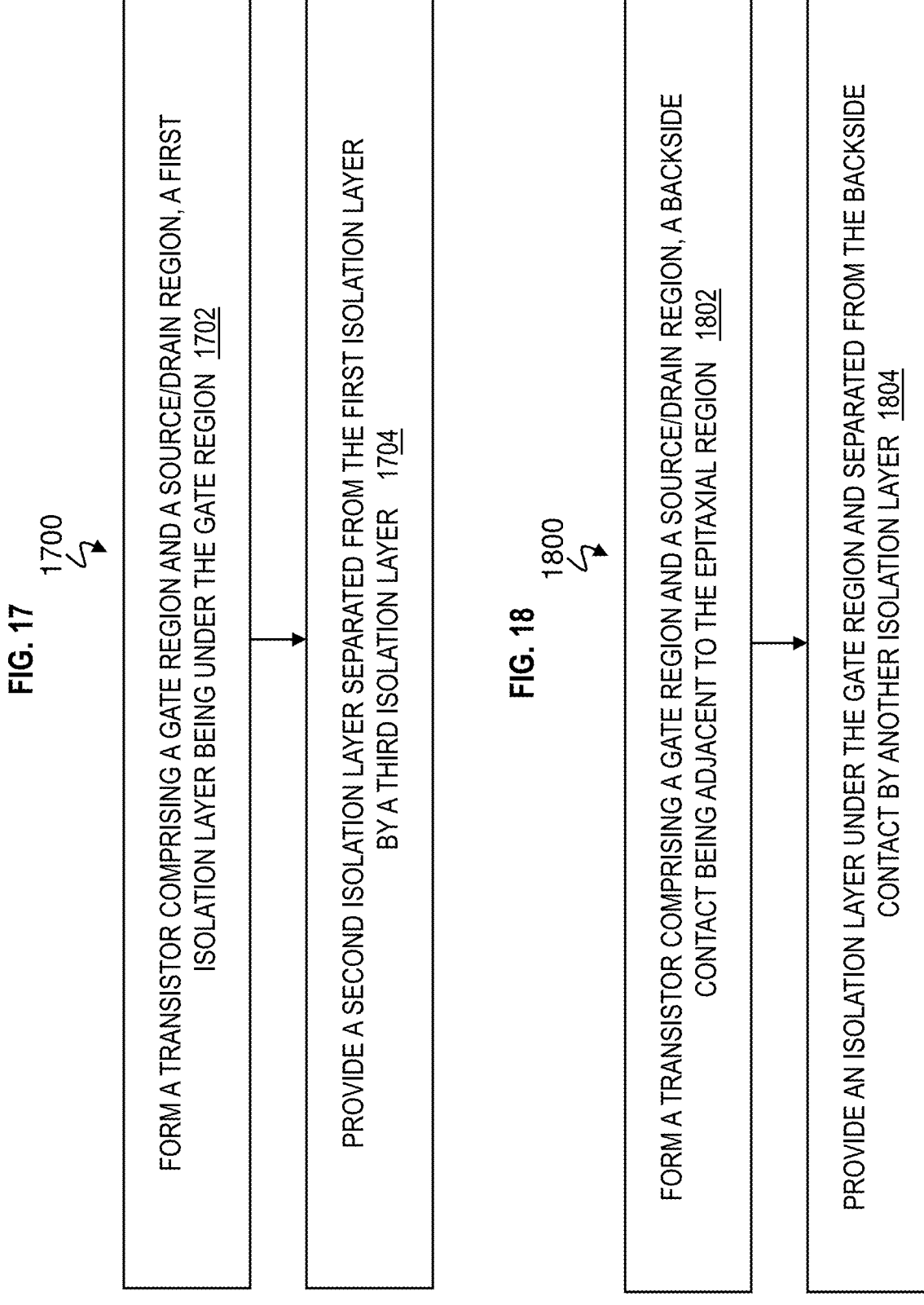

FORM A TRANSISTOR COMPRISING A GATE REGION AND A SOURCE/DRAIN REGION, A FIRST ISOLATION LAYER BEING UNDER THE GATE REGION  1702

PROVIDE A SECOND ISOLATION LAYER SEPARATED FROM THE FIRST ISOLATION LAYER BY A THIRD ISOLATION LAYER  1704

FORM A TRANSISTOR COMPRISING A GATE REGION AND A SOURCE/DRAIN REGION, A BACKSIDE CONTACT BEING ADJACENT TO THE EPITAXIAL REGION  1802

PROVIDE AN ISOLATION LAYER UNDER THE GATE REGION AND SEPARATED FROM THE BACKSIDE CONTACT BY ANOTHER ISOLATION LAYER  1804

NANOSHEET WITH DUAL ISOLATION REGIONS SEPARATED BY BURIED INNER SPACER

BACKGROUND

The present invention generally relates to fabrication methods and resulting structures for integrated circuits (ICs), and more specifically, to fabrication methods and resulting structures configured and arranged for providing nanosheets with dual isolation regions separated by buried inner spacers.

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., formed in layers of the IC and interconnected with wiring in the back-end-of-line (BEOL) layers of the wafer. Typical ICs are formed by first fabricating individual semiconductor devices using processes referred to generally as the front-end-of-line (FEOL). A metal-oxide-semiconductor field-effect transistor (MOS-FET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

While existing nanosheet transistors are suitable for their intended purposes, what is needed is further methods and resulting structures for nanosheet transistors which can prevent sub-sheet leakage according to one or more embodiments discussed herein.

SUMMARY

Embodiments of the present invention are directed to providing fabrication methods and resulting structures for nanosheet transistors with dual isolation regions separated by buried inner spacers. A non-limiting method includes forming a transistor comprising a gate region and a source/drain region, a first isolation layer being under the gate region. The method includes providing a second isolation layer separated from the first isolation layer by a third isolation layer.

This can provide an improvement over known methods for nanosheet transistor by providing dual isolation regions that fully suppress sub-sheet leakage from one source/drain region to another source/drain region under the gate. The dual isolation regions (or triple isolation regions) achieve bottom dielectric isolation performance without the restrictions of a single bottom dielectric isolation layer.

In addition to one or more of the features described above or below, or as an alternative, further embodiments of the invention disclose wherein the first isolation layer is under inner spacers that are adjacent to the gate region. This advantageously allows for the first isolation layer to assist with suppressing leakage from one source/drain region to another source/drain region under the gate.

In addition to one or more of the features described above or below, or as an alternative, further embodiments of the invention disclose wherein the second isolation layer is under the source/drain region. This advantageously allows for the second isolation layer to assist with suppressing leakage from one source/drain region to another source/drain region under the gate.

In addition to one or more of the features described above or below, or as an alternative, further embodiments of the invention disclose wherein the third isolation layer is under the source/drain region. This advantageously allows for the third isolation layer to assist with suppressing leakage from one source/drain region to another source/drain region under the gate. Further, the third isolation layer is a buried inner spacer that protects the sidewalls of the first isolation layer during the epitaxial pre-clean, thereby avoiding punch-through and epitaxial growth from the substrate.

In addition to one or more of the features described above or below, or as an alternative, further embodiments of the invention disclose wherein the third isolation layer comprises inner spacer material and is formed on a sidewall of the first isolation layer, inner spacers being formed adjacent to the source/drain region and comprising the inner spacer material. This advantageously allows for the third isolation layer to assist with suppressing leakage from one source/drain region to another source/drain region under the gate. Further, the third isolation layer is a buried inner spacer that protects the sidewalls of the first isolation layer during the epitaxial pre-clean, thereby avoiding punchthrough and epitaxial growth from the substrate.

In addition to one or more of the features described above or below, or as an alternative, further embodiments of the invention disclose wherein the third isolation layer comprises a different width than an inner spacer. This advantageously allows for the third isolation layer to assist with suppressing leakage from one source/drain region to another source/drain region under the gate.

In addition to one or more of the features described above or below, or as an alternative, further embodiments of the invention disclose wherein the third isolation layer extends from an inner spacer. This advantageously allows for the third isolation layer to be formed during the formation of the inner spacers.

In addition to one or more of the features described above or below, or as an alternative, further embodiments of the invention disclose wherein the first and second isolation layers comprise different thicknesses. This advantageously allows for the first and second isolation layers to suppress sub-sheet leakage from one source/drain region to another source/drain region under the gate.

In addition to one or more of the features described above or below, or as an alternative, further embodiments of the invention disclose wherein the first and second isolation layers comprise different materials. This advantageously allows for layers to suppress sub-sheet leakage from one source/drain region to another source/drain region under the gate.

In addition to one or more of the features described above or below, or as an alternative, further embodiments of the invention disclose wherein the third isolation layer is adjacent to the first isolation layer, the second isolation layer, and the source/drain region. This advantageously allows for the third isolation layer to assist with suppressing leakage from one source/drain region to another source/drain region under the gate. Further, the third isolation layer is a buried inner spacer that protects the sidewalls of the first isolation layer during the epitaxial pre-clean, thereby avoiding punch-through and epitaxial growth from the substrate.

According to one of more embodiments of the invention, a non-limiting method includes forming a transistor comprising a gate region and a source/drain region, a backside contact being adjacent to the epitaxial region. The method includes providing an isolation layer under the gate region and separated from the backside contact by another isolation layer. This can provide an improvement over known methods for nanosheet transistor by providing dual isolation regions that fully suppress sub-sheet leakage from one source/drain region to another source/drain region under the gate. The dual isolation regions achieve bottom dielectric isolation performance without the restrictions of a single bottom dielectric isolation layer. Further, the other isolation layer is a buried inner spacer that protects the sidewalls of the first isolation layer during the epitaxial pre-clean, thereby avoiding punchthrough.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

4

Figure 9:
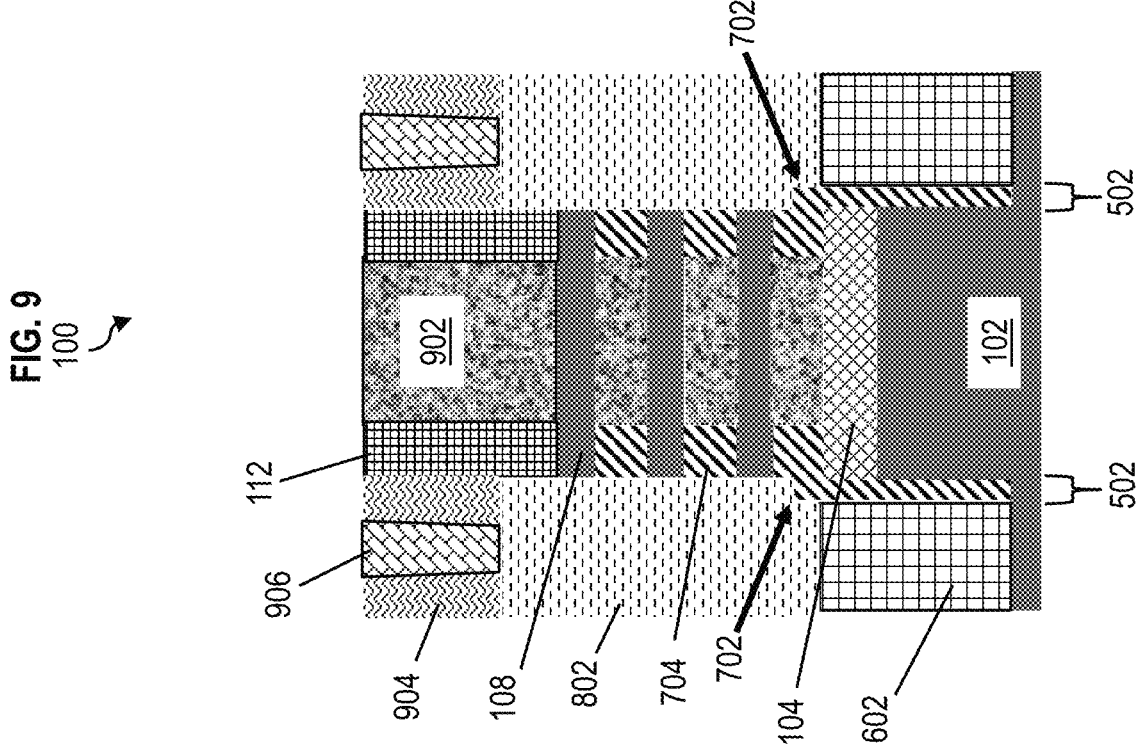
Figure 10:
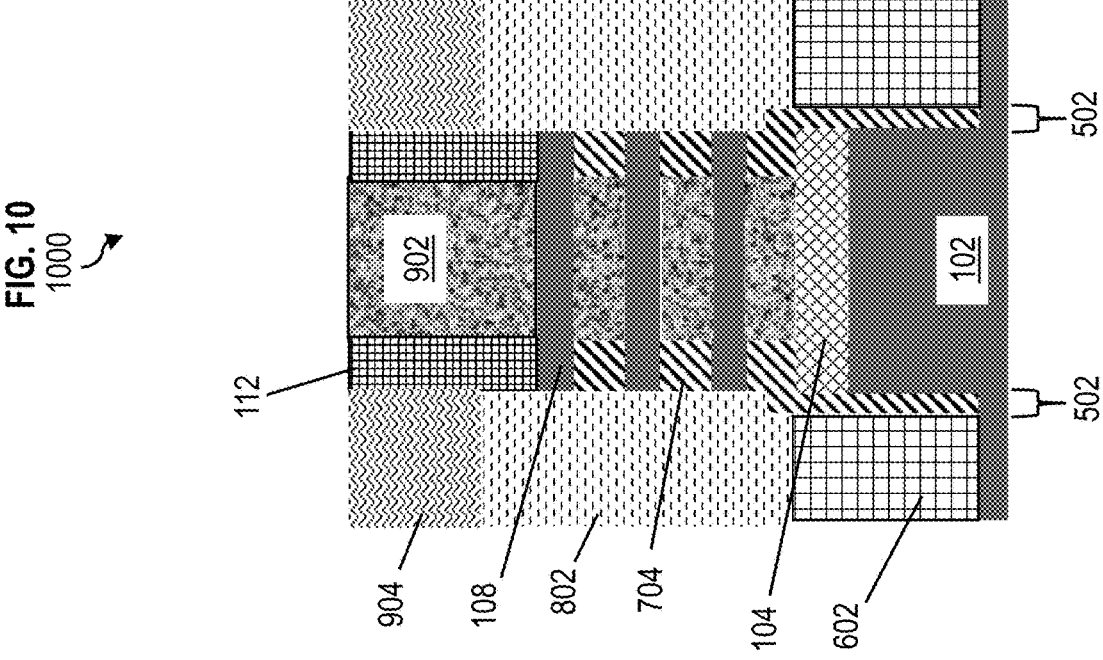
Figure 11:
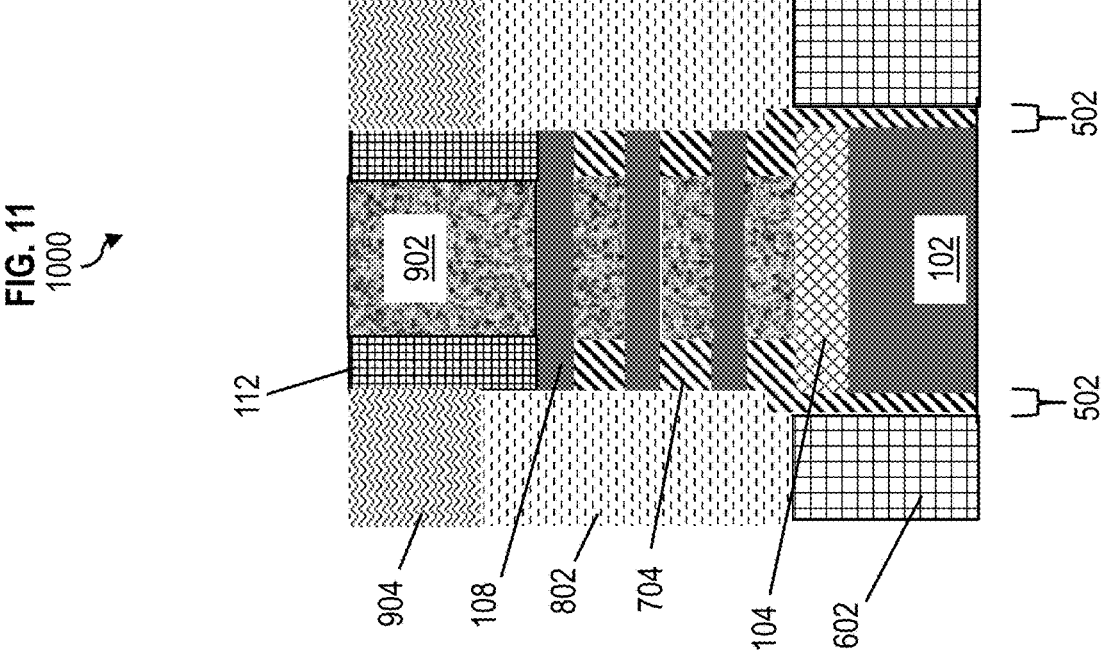
Figure 12:
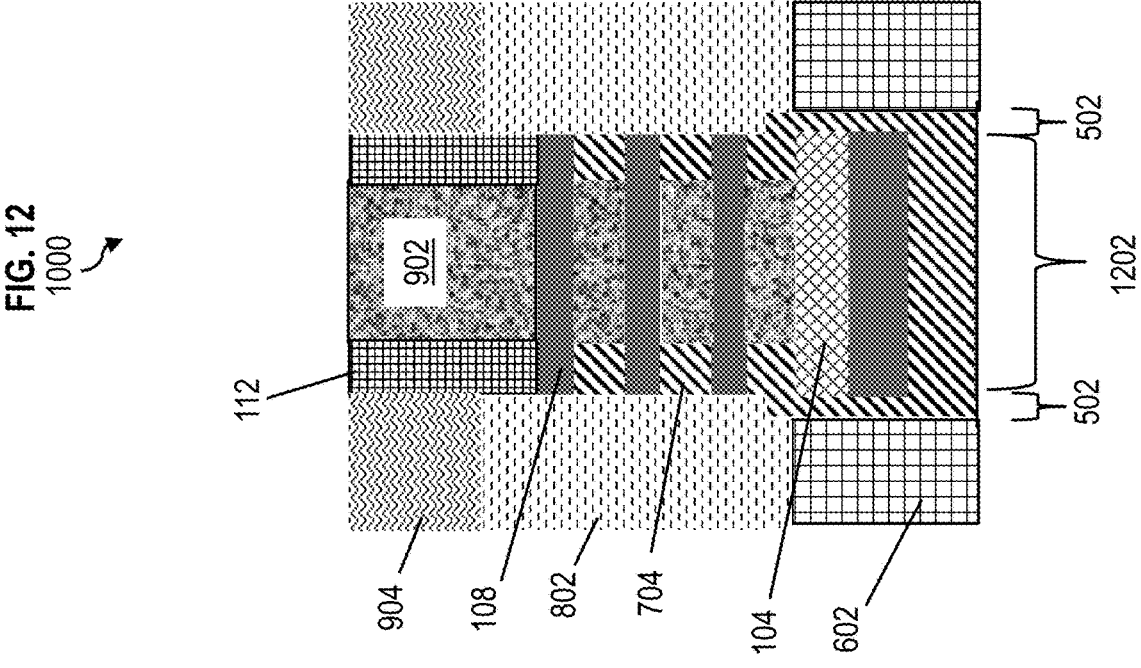
Figure 13:
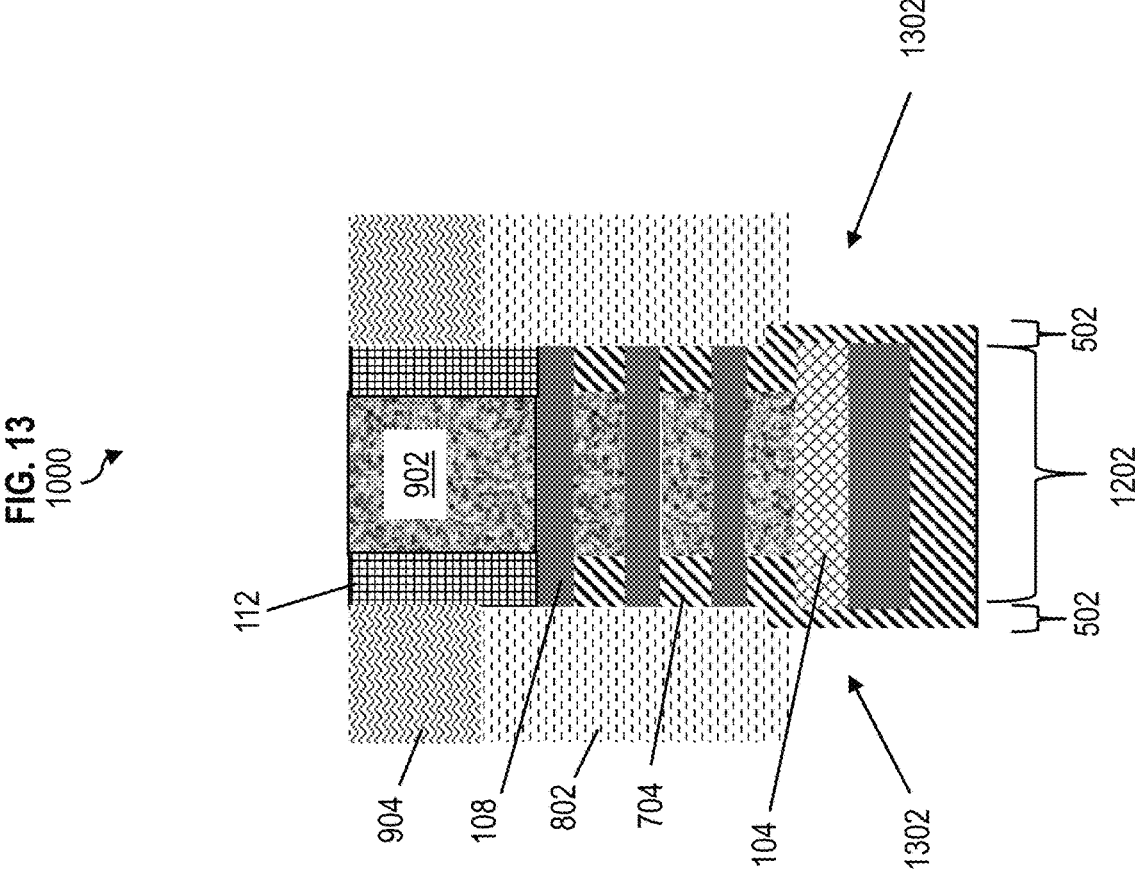
Figure 14:
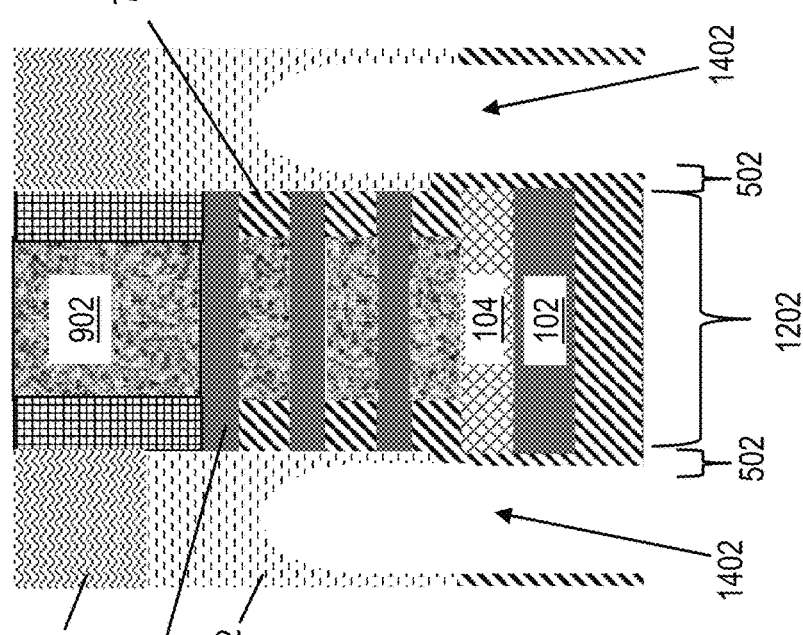
Figure 15:
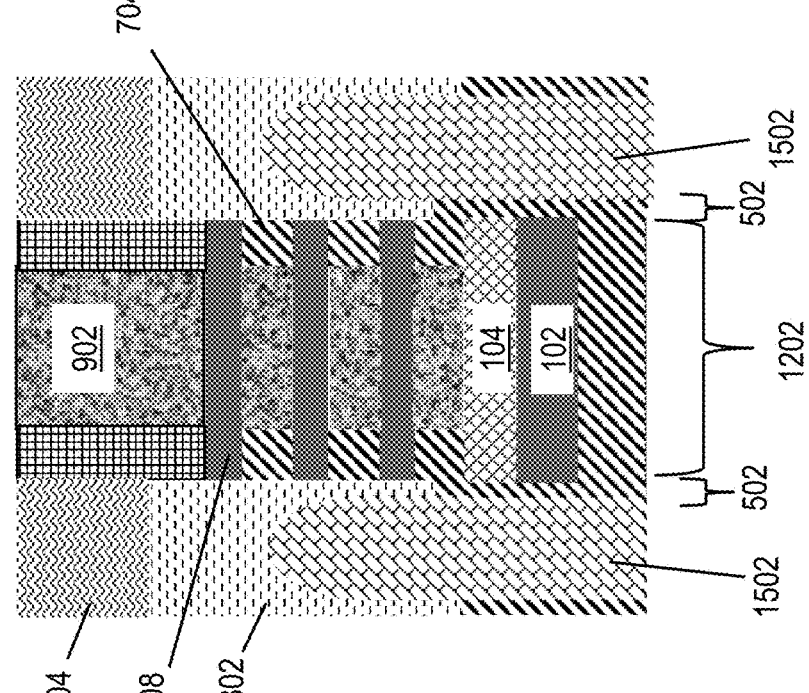
Figure 16:
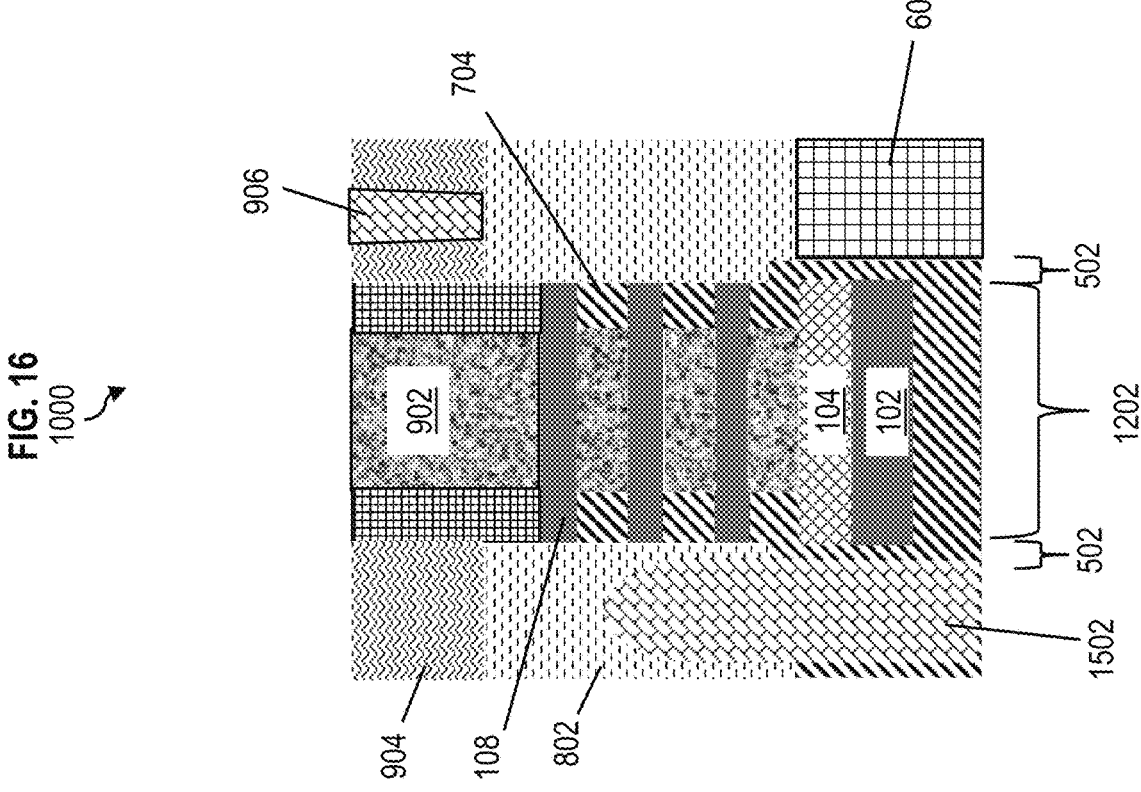

FIG. 9 depicts a cross-sectional view of a portion of an IC under-fabrication after fabrication operations according to one or more embodiments of the invention;

FIG. 10 depicts a cross-sectional view of a portion of an IC under-fabrication after fabrication operations according to one or more embodiments of the invention;

FIG. 11 depicts a cross-sectional view of a portion of an IC under-fabrication after fabrication operations according to one or more embodiments of the invention;

FIG. 12 depicts a cross-sectional view of a portion of an IC under-fabrication after fabrication operations according to one or more embodiments of the invention;

FIG. 13 depicts a cross-sectional view of a portion of an IC under-fabrication after fabrication operations according to one or more embodiments of the invention;

FIG. 14 depicts a cross-sectional view of a portion of an IC under-fabrication after fabrication operations according to one or more embodiments of the invention;

FIG. 15 depicts a cross-sectional view of a portion of an IC under-fabrication after fabrication operations according to one or more embodiments of the invention;

FIG. 16 depicts a cross-sectional view of a portion of an IC under-fabrication after fabrication operations according to one or more embodiments of the invention;

FIG. 17 is a flowchart of a computer-implemented method of forming a nanosheet transistor with dual isolation regions separated by buried inner spacers according to one or more embodiments of the invention; and FIG. 18 is a flowchart of a computer-implemented method of forming a nanosheet transistor with dual isolation regions separated by buried inner spacers according to one or more embodiments of the invention.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments disclose fabrication methods and resulting structures for providing nanosheets with dual isolation regions separated by buried inner spacers. For a nanosheet transistor, a nanosheet stack is provided with a first isolation layer under the gate region and a second isolation layer under the source and drain regions. The first and second isolation layers are physically separated by a third isolation layer which is an inner spacer layer extending into the substrate, according to one or more embodiments. A portion of the inner spacer material, which is the third isolation layer, extending into the substrate has a different thickness than the inner spacer formed between the nanosheets. The first and second isolation layers have a different thickness. The first and second isolation layers are formed of different materials.

In state-of-the-art transistors, the bottom dielectric isolation region in nanosheet FETs is relatively thin (e.g., approximately (~) 10 nanometers (nm)), because of the critical thickness of the sacrificial silicon germanium layer (e.g., SiGe55 where germanium has an atomic percent (%)

of about 55%) used to form the bottom dielectric isolation region. This leaves very little margin for source/drain recess etch and epitaxial pre-clean without punching through the bottom dielectric isolation region under the source/drain region. This can lead to sub-sheet leakage in the substrate because the source/drain junction directly contacts the substrate.

According to one or more embodiments of the invention, a method is provided for "re-isolating" the source/drain epitaxial regions from the substrate. Further, this has the added benefit of enabling self-aligned backside source/drain contacts to the bottom of the source/drain regions in a backside power delivery network (BSPDN) process flow.

According to one or more embodiments, the nanosheet transistor includes two (discontinuous) isolation layers (e.g., first and second isolation layers) separated by a buried inner spacer which serves as a third isolation layer. The first isolation layer under the gate may be formed using a conventional isolation layer fabrication. The second isolation layer may be formed at a stage between inner spacer formation and source/drain epitaxial formation, using a dielectric fill and etch back. The second isolation layer can be a different material from first isolation layer. For example, the first isolation layer can be a low-k dielectric material, in order to reduce gate-to-substrate capacitance. The second isolation layer should be a "harder" material (typically higher-k material than the first isolation layer), in order to resist epitaxial pre-clean penetration. The buried inner spacer, which is the third isolation layer, protects first isolation layer sidewall during the epitaxial pre-clean, thereby avoiding punch through and epitaxial growth from the substrate. The buried inner spacer thickness of the third isolation layer can be tuned to optimize backside source/drain contact offset. This assures a source/drain-to-epitaxial contact along the source/drain contact sidewall as it gouges into the epitaxial material of the source/drain regions.

Figures 1A, 1B:
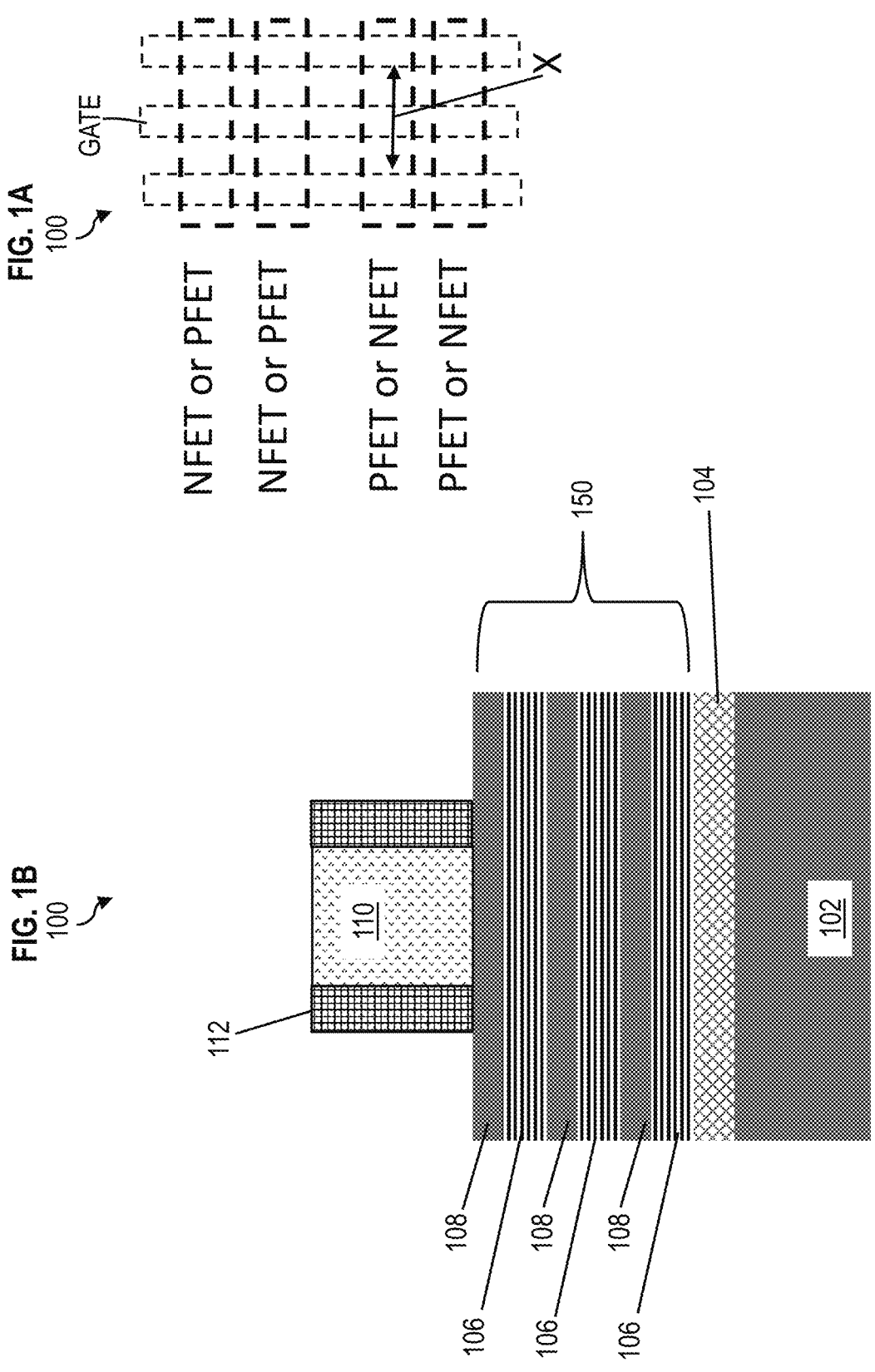
FIG. 1A depicts a top view of a portion of an integrated circuit (IC) under-fabrication after fabrication operations according to one or more embodiments of the invention.
FIG. 1B depicts a cross-sectional view of a portion of an IC under-fabrication after fabrication operations according to one or more embodiments of the invention.

Turning now to a more detailed description of aspects of the present invention, FIG. 1A depicts a top view of a simplified illustration of a portion of an integrated circuit (IC) 100 and FIG. 1B depicts a cross-sectional view taken along X of the IC 100. For ease of understanding, some layers may be omitted from the top views so as not to obscure the figure. Although not necessarily formed at this stage, the top view represents nanosheet stacks as fins that are perpendicular to gates. As such, the top view is intended to provide a simplified illustration and a general orientation. Standard semiconductor fabrication techniques can be utilized to fabricate IC 100 as understood by one of ordinary skill in the art. Any suitable lithography processes including deposition techniques and etching techniques can be utilized herein.

FIG. 1B depicts the IC 100 after several fabrication processes have been performed. The IC 100 can start with a wafer or substrate 102 where a nanosheet stack 150 is formed on the substrate 102. The wafer or substrate 102 may be formed of silicon. Other suitable materials can be utilized for the substrate 102.

Initially, the nanosheet stack 150 includes layers 106 formed in between layers 108. The layers 108 are semiconductor material and may be substantially pure silicon or any suitable materials. The layers 108 are to be utilized as the channel regions for the FET device. The layers 106 are sacrificial layers formed of silicon germanium (SiGe) where germanium has an atomic percent (%) of about 30%, thereby leaving silicon with an atomic percent of about 70%. In layers 106, the atomic percent of germanium may range from about 20-35%, while silicon is the remainder.

A first isolation layer 104 is formed between the nanosheet stack 150 and the substrate 102. Previously, a sacrificial layer (not shown) of silicon germanium was present (as a placeholder) that had a higher content of germanium than the layers 106, for example, the atomic percent of germanium may have been about 55-65%, while silicon is the remainder; as such, the sacrificial layer of silicon germanium (as the placeholder) was selectively etched, and deposition was performed to result in the formation of the first isolation layer 104. The first isolation layer 104 can be a low-k material or ultralow-k material. Low-k dielectric materials may generally include dielectric materials having a k value of about 5.5 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraethoxysilane (TEOS).

A dummy gate 110 is formed and patterned using standard processing. The dummy gate 110 is sacrificial in nature in that it is replaced at a later point in the process flow with other materials to form functional gate structures, as described below. The dummy gate 110 may include one or more layers of material, such a sacrificial gate material (e.g., amorphous silicon or polysilicon). Gate spacers 112 are formed on the sidewalls of the dummy gate 110. The gate spacers 112 may include a dielectric such as a nitride, oxide, oxynitride, etc.

Figure 2:
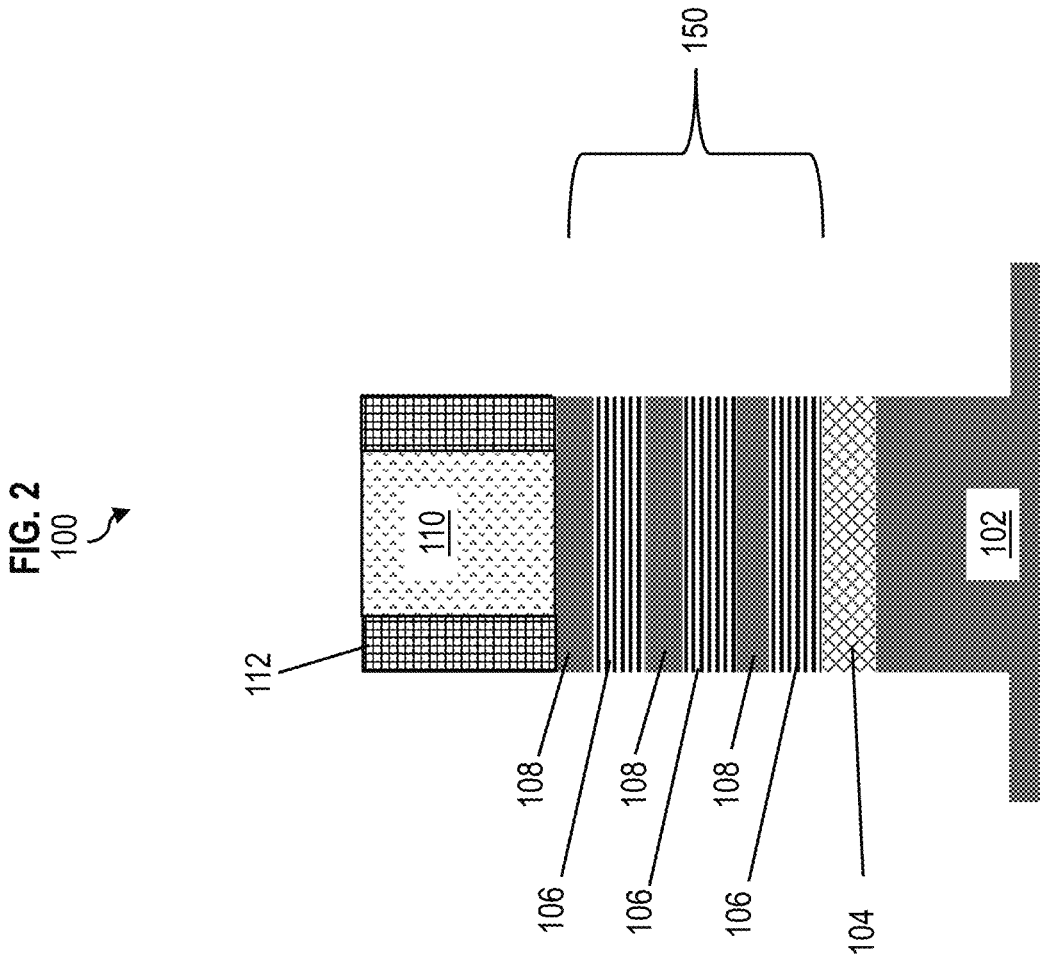
FIG. 2 depicts a cross-sectional view of a portion of an IC under-fabrication after fabrication operations according to one or more embodiments of the invention.

FIG. 2 depicts the IC 100 after etching in preparation for source/drain formation. For example, using a patterned hard mask layer (not shown), fin patterning is performed to form the nanosheet stack 150 into fins, which also punches through the first isolation layer 104. The etching continues into portions of the substrate 102 in preparation for source/drain formation.

Figure 3:
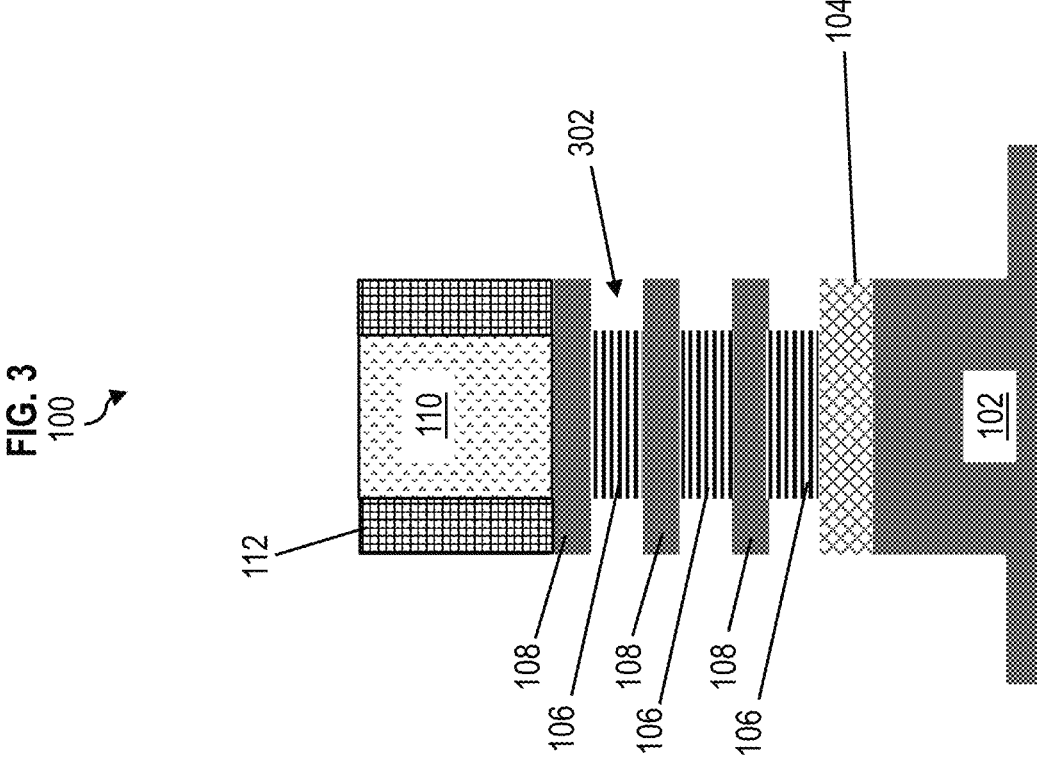
FIG. 3 depicts a cross-sectional view of a portion of an IC under-fabrication after fabrication operations according to one or more embodiments of the invention.

FIG. 3 depicts the IC 100 after etching in preparation for inner spacer formation. An etch is performed to selectively remove portions of the layers 106. For example, an isotropic etch process is performed to selectively recess the layers 106 in order to define end cavities 302 on ends thereof.

Figure 4:
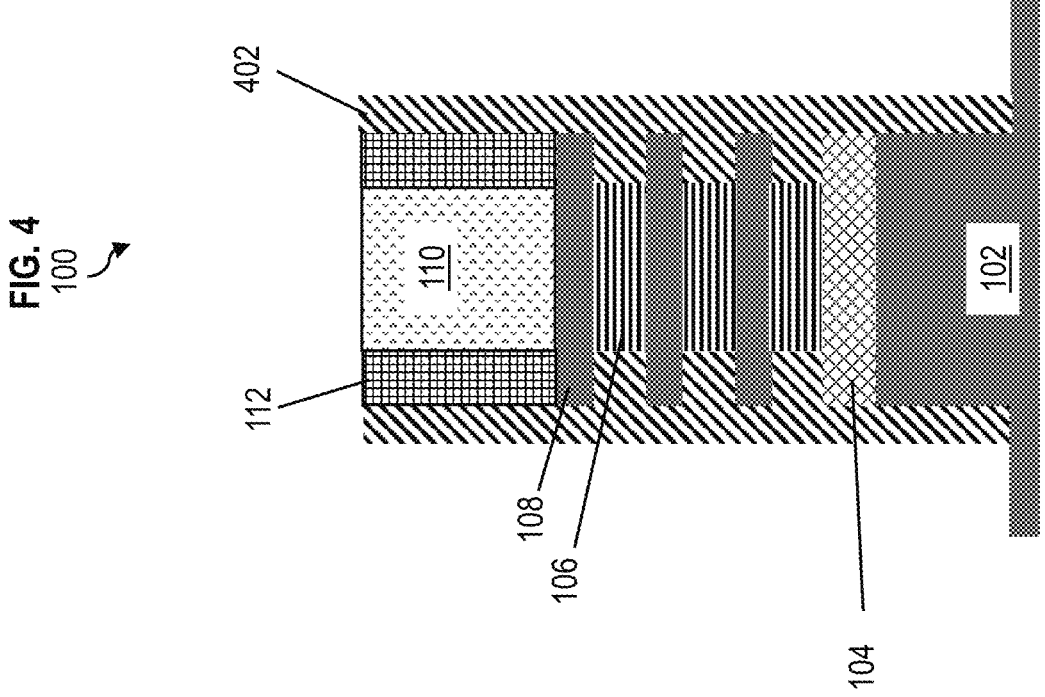
FIG. 4 depicts a cross-sectional view of a portion of an IC under-fabrication after fabrication operations according to one or more embodiments of the invention;

FIG. 4 depicts the IC 100 after deposition of inner spacer material. A conformal deposition process, such as an ALD process, is performed to form a layer of inner spacer material 402 on the nanosheet stack 150, and the inner spacer material is anisotropically etched. Example materials of the inner spacer material 402 may include SiBCN, SiOCN, SiN, SiOC, SiC, etc. The inner spacer material 402 can be a nitride with oxygen, carbon, and/or boron added. In one example, the inner spacer material 402 may include silicon dioxide. The inner spacer material 402, which is utilized to form the third isolation layer, is a different material from the first isolation layer 104, as well as the second isolation layer 602 discussed in FIG. 6.

Figure 5:
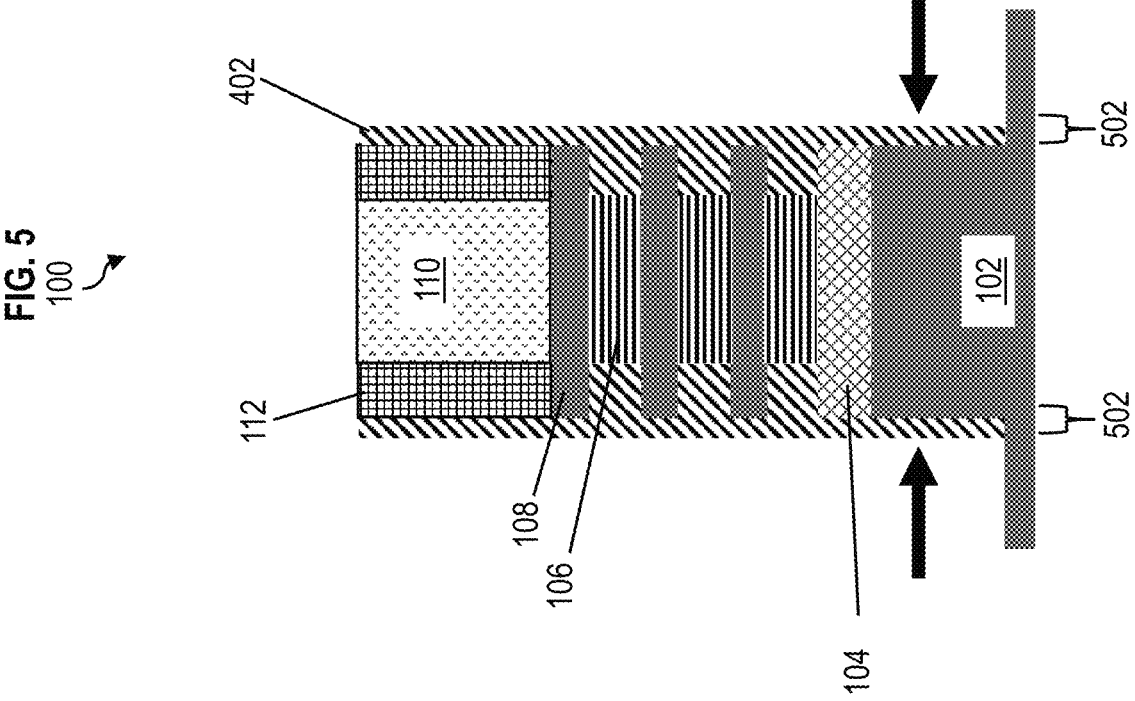
FIG. 5 depicts a cross-sectional view of a portion of an IC under-fabrication after fabrication operations according to one or more embodiments of the invention.

FIG. 5 depicts the IC 100 after a partial inner spacer etch back. For example, further etching, as depicted by the solid arrows, can be performed to define third isolation layers 502 on the sidewalls of the substrate 102 and first isolation layer 104. To further etch the inner spacer material 402, a wet etch or a dry etch may be utilized. As an example dry etch, a RIE etch with $CF_4$ can be utilized to make the etching more isotropic by appropriately changing the gas and power. As an example wet etch, a dilute phosphoric acid can be utilized. It should be appreciated that any type of isotropic etch that is suitable for etching nitride may be utilized.

Figure 6:
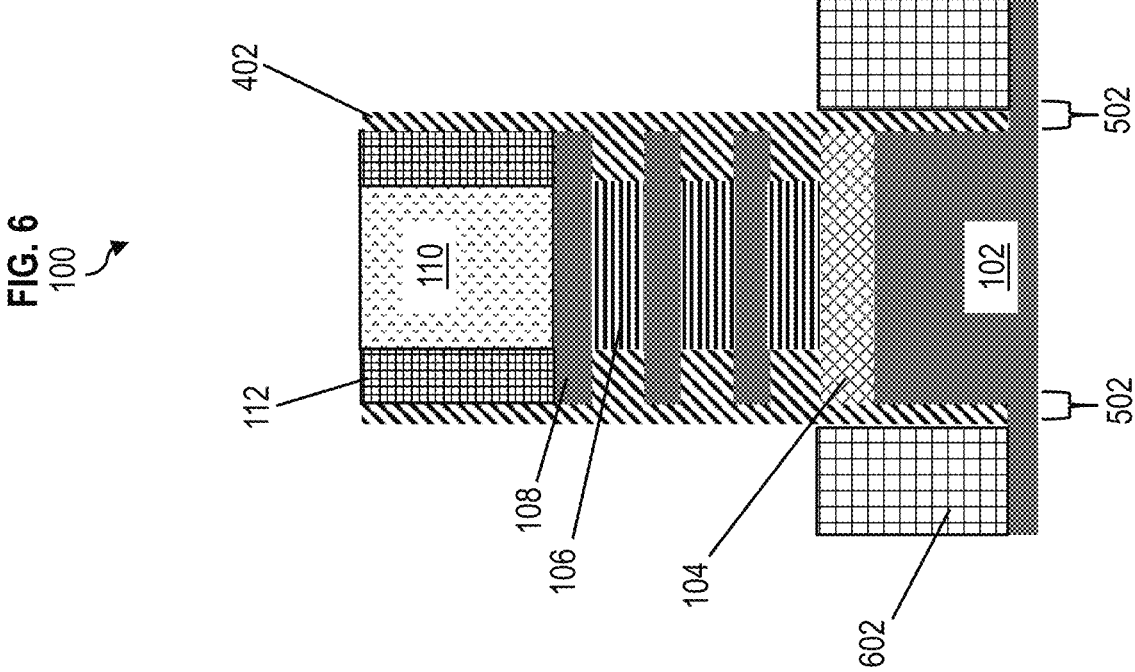
FIG. 6 depicts a cross-sectional view of a portion of an IC under-fabrication after fabrication operations according to 60 one or more embodiments of the invention.

FIG. 6 depicts the IC 100 after a dielectric fill and recess. A dielectric material is deposited and recessed to form a second isolation layer 602. The first isolation layer 104 and the second isolation layer 602 sandwich the third isolation layer 502 in between. The second isolation layer 602 can be an oxide, for example, silicon dioxide, germanium oxide, aluminum oxide, etc. The second isolation layer 602 is a different material from the third isolation layer 502, such that the material of the second isolation layer 602 can be selectively etched without etching the third isolation layer 502. A dry or wet etch may be utilized to recess the dielectric material of the second isolation layer 602. In one example, a dilute HCl acid can be utilized.

Figure 7:
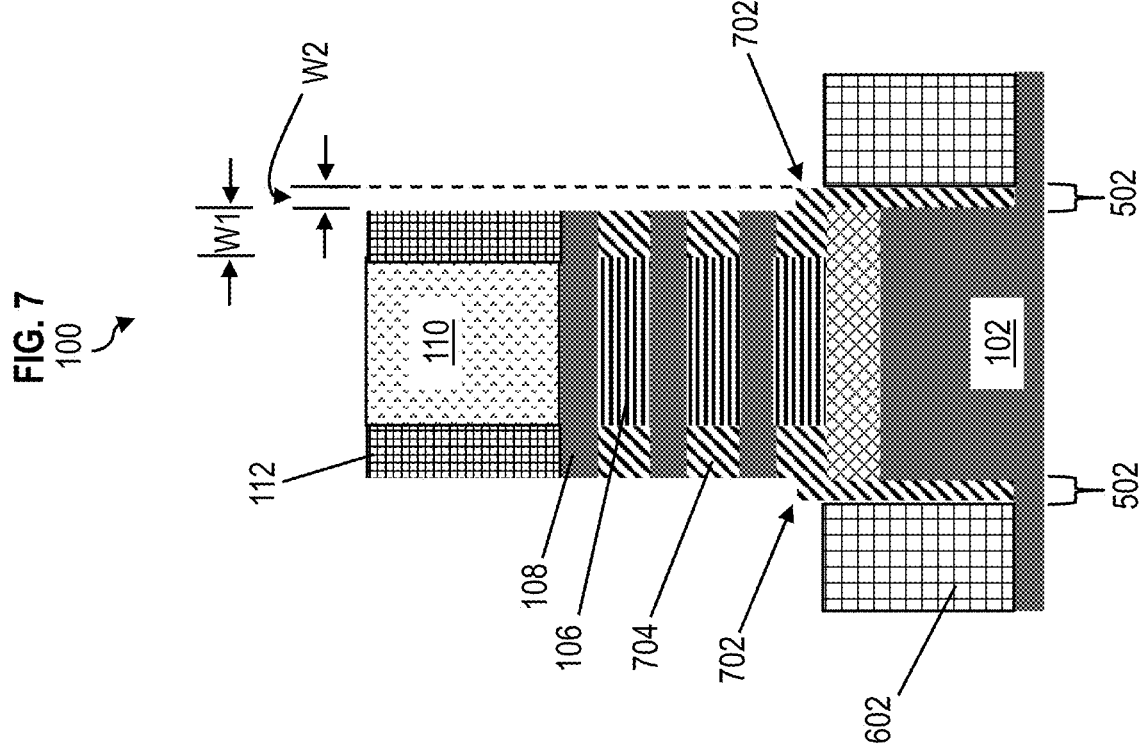
FIG. 7 depicts a cross-sectional view of a portion of an IC under-fabrication after fabrication operations according to one or more embodiments of the invention.

FIG. 7 depicts the IC 100 after final inner spacer etch back. An isotropic etch can be utilized to selectively etch the inner spacer material 402 as previously discussed herein, thereby resulting in inner spacers 704 in the cavities 302 (depicted in FIG. 3). In one or more embodiments, the etching may result in step portions 702 of the third isolation layer 502. In one or more embodiments, there may not appear to be the step portions 702 or they may have a shorter height. The inner spacers 704 have a width W1 while the third isolation layers 502 have a width W2, where the width W2 is less than the width W1.

In one or more embodiments, the third isolation layer 502 is below the bottom most nanosheet layer 108. In one or more embodiments, the top surface of the third isolation layer 502 is below the bottom surface of the bottom most nanosheet layer 108. In one or more embodiments, the height of the third isolation layer 502 is such that the third isolation layer 502 at least covers the sidewall of the first isolation layer 104.

Figure 8:
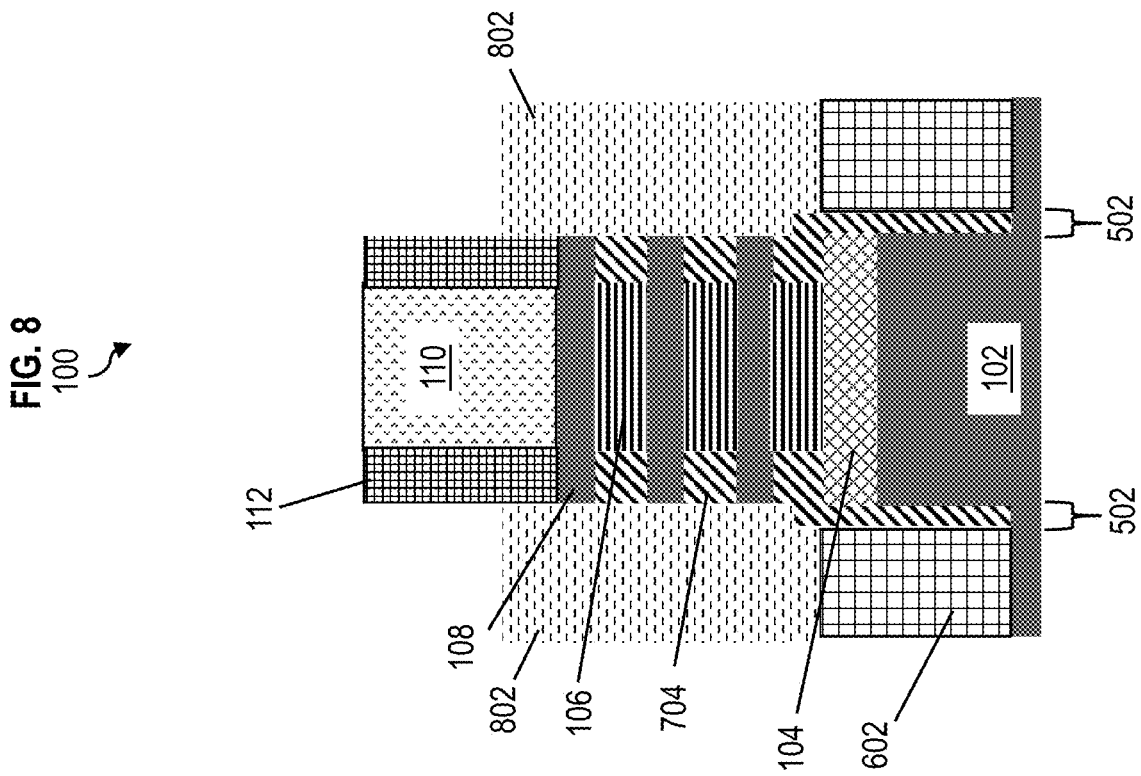
FIG. 8 depicts a cross-sectional view of a portion of an IC under-fabrication after fabrication operations according to one or more embodiments of the invention.

FIG. 8 depicts the IC 100 after source and drain formation. The epitaxial layers 802 are epitaxially grown from the layers 108. For P-type FETs (PFETs), the epitaxial layers 802 may be doped to be P-type epitaxial material, resulting in P-type source and drain regions. For N-type FETs (NFETs), the epitaxial layers 802 may be doped to be N-type epitaxial material, resulting in N-type source and drain regions. A portion of the epitaxial layers 802 sits directly on the second isolation layers 602. Another portion of the epitaxial layers 802 sits directly on the third isolation layers 502.

FIG. 9 depicts the IC 100 after dummy gate removal. The dummy gate 110 is removed, and the sacrificial layers 106 (SiGe) are released. Replacement metal gate (RMG) formation is performed, thereby forming a gate structure 902. The replacement metal gate process is performed to deposit a high-k dielectric material followed by one or more work function material layers to thereby form the gate structure 902. An interlayer dielectric (ILD) material 904 may be formed, and cavities are formed in the ILD material 904 exposing one or more of the epitaxial layers 802. The ILD material 904 can be a low-k dielectric material or an ultralow-low k dielectric material. A metal is deposited to fill the cavities thereby forming the source/drain metal contacts

906. A portion of the source/drain metal contacts 906 may include silicide, resulting from the interface of the metal material and semiconductor material.

Although the source/drain metal contacts can be formed on the front side of the IC 100, one or more of the source/drain metal contacts can be formed on the backside of the IC, as discussed in FIGS. 10-17. FIG. 10 depicts the IC 1000 without the top source/drain metal contacts present. The IC 1000 is analogous to the IC 100 with the exception of the top source/drain metal contacts. Accordingly, the fabrication processes previously discussed are not repeated.

FIG. 11 depicts the IC 1000 as a representation after wafer flip and partial substrate removal. The front side is the top and the backside refers to the bottom. The following fabrication processes are performed with the backside up and positioned for processing, as understood by one of ordinary skill in the art. However, the front side and backside of the wafer are not shown as flipped in the figures so as not to disorient the reader, although it should be appreciated that the wafer is flipped, and the fabrication is now being performed to the backside. Planarization is performed to remove part of the substrate 102, with etching stopping on the second isolation layer 602 and/or third isolation layer 502. The substrate can be removed by a combination of wafer grinding, chemical mechanical polishing/planarization (CMP), and/or dry/wet etch process.

FIG. 12 depicts the IC 1000 after silicon recess and nitride cap fill. A selective etch is performed to recess at least a portion of the substrate 102, and the resulting cavity is filed with a nitride material to form a self-aligned cap (SAC) layer 1202. Example materials of the SAC layer 1202 may include SiBCN, SiOCN, SiN, etc. The material of the SAC layer 1202 can be a nitride with oxygen, carbon, and/or boron added. In one or more embodiments, the SAC layer 1202 may be the same material as the inner spacer material 402 that forms the third isolation layer 502.

FIG. 13 depicts the IC 1000 after self-aligned source/drain open. The second isolation layer 602 can be an oxide material. A selective oxide etch is performed to open or expose the bottom surface of the (source/drain) epitaxial layers 802, resulting in cavities 1302. A dilute HCl acid based etch may be utilized to remove the second isolation layer 602.

FIG. 14 depicts the IC 1000 after formation of a self-aligned source/drain gouge. This gouge is self-aligned by virtue of the SAC layer 1202 as well as the third isolation layer 502 existing on both sides of the etch opening (due to the presence of an adjacent transistor). Etching is performed to etch into part of the epitaxial layers 802, thereby forming gouges or cavities 1402 on the backside of the IC 1000. An RIE etch may be utilized. Masks may be utilized to protect other layers from being etched during the formation of cavities 1402. For example, a mask layer can be deposited and etched. The mask layer may include organic patterning layer (OPL) and/or any suitable material or combination of materials. An anisotropic etch may be utilized to etch the mask layer. Using the patterned mask layer, etching is performed through exposed portions of the IC 1000 which are not covered by the mask, thereby resulting in cavities 1402.

Prior to forming source/drain metal contacts, an epitaxial pre-clean can be performed. The third isolation layer 502 material substantially resistant to epitaxial pre-clean chemistry. In one example, the epitaxial pre-clean can be a dilutee HCl acid, ammonia, and/or dry gas component.

FIG. 15 depicts the IC 1000 after silicidation and metal contact fill. A metal is deposited to fill the cavities 1402, thereby forming the backside source/drain metal contacts 1502. A portion of the source/drain metal contacts 1502 may include silicide, resulting from the interface of the metal material and semiconductor material.

In one or more embodiments, there can be metal contacts on the front side and backside of the IC. FIG. 16 depicts the IC 1000 with a top source/drain metal contact 906 and a backside source/drain metal contact 1502.

Although examples illustrate fabrication processes for a single nanosheet transistor which could be an NFET or PFET, it should be appreciated that an IC has numerous transistors (e.g., PFETs and NFETs). There can be hundreds, thousands, millions, or billions of transistors in an IC, with at least some transistors formed according to one or more embodiments discussed herein.

FIG. 17 is a flowchart of a computer-implemented method 1700 for nanosheet transistors with dual isolation regions separated by buried inner spacers according to one or more embodiments. At block 1702, the method 1700 includes forming a transistor comprising a gate region (e.g., gate structure 902) and an epitaxial region (e.g., epitaxial layers 802), a first isolation layer 104 being under the gate region. At block 1704, the method 1700 includes providing a second isolation layer 602 separated from the first isolation layer 104 by a third isolation layer 502.

The first isolation layer 104 is under inner spacers 704 that are adjacent to the gate region (e.g., gate structure 902). The second isolation layer 602 is under the epitaxial region (e.g., epitaxial layers 802). The third isolation layer 502 is under the epitaxial region (e.g., epitaxial layers 802). The third isolation layer 502 comprises inner spacer material 402 and is formed on a sidewall of the first isolation layer 104, inner spacers 704 being formed adjacent to the epitaxial region and comprising the inner spacer material 402.

The third isolation layer 502 (having width W2) comprises a different width than an inner spacer 704 (having width W1), where the width W1 is greater than width W2. The third isolation layer extends from an inner spacer 704. The first and second isolation layers comprise different thicknesses. For example, the thickness of the second isolation layer 602 is greater than the thickness of the first isolation layer 104. The first and second isolation layers comprise different materials. The third isolation layer 502 is adjacent to each of the first isolation layer 104, the second isolation layer 602, and the epitaxial region 802.

FIG. 18 is a flowchart of a computer-implemented method 1800 for nanosheet transistors with dual isolation regions separated by buried inner spacers according to one or more embodiments. At block 1802, the method 1800 include forming a transistor comprising a gate region (e.g., gate structure 902) and an epitaxial region (e.g., epitaxial layer 802), a backside contact (e.g., backside source/drain metal contact 1502) adjacent to the epitaxial region. At block 1804, the method 1800 includes an isolation layer (e.g., first isolation layer 104) under the gate region (e.g., gate structure 902) and separated from the backside contact by another isolation layer (e.g., third isolation layer 502).

The isolation layer (e.g., first isolation layer 104) is under inner spacers 704) that are adjacent to the gate region (e.g., gate structure 902). The another isolation layer (e.g., third isolation layer 502) is under the epitaxial region. The another isolation layer e.g., third isolation layer 502) comprises inner spacer material 402 and is formed on a sidewall of the isolation layer (e.g., first isolation layer 104), inner spacers 704 being formed adjacent to the epitaxial region and comprising the inner spacer material 402.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
a transistor comprising a gate region and a source/drain region, a first isolation layer being under the gate region; and
a second isolation layer separated from the first isolation layer by a third isolation layer, wherein the second isolation layer is in contact with the source/drain region.

2. The semiconductor structure of claim 1, wherein the first isolation layer is under inner spacers that are adjacent to the gate region.

3. The semiconductor structure of claim 1, wherein the second isolation layer is under the source/drain region.

4. The semiconductor structure of claim 1, wherein the third isolation layer is under the source/drain region.

5. The semiconductor structure of claim 1, wherein the third isolation layer comprises inner spacer material and is formed on a sidewall of the first isolation layer, inner spacers being formed adjacent to the source/drain region and comprising the inner spacer material.

6. The semiconductor structure of claim 1, wherein the third isolation layer comprises a different width than an inner spacer.

7. The semiconductor structure of claim 1, wherein the third isolation layer extends from an inner spacer.

8. The semiconductor structure of claim 1, wherein the first and second isolation layers comprise different thicknesses.

9. The semiconductor structure of claim 1, wherein the first and second isolation layers comprise different materials.

10. The semiconductor structure of claim 1, wherein the third isolation layer is adjacent to the first isolation layer, the second isolation layer, and the source/drain region.

11. A method comprising;
forming a transistor comprising a gate region and source/drain region, a first isolation layer being under the gate region; and
providing a second isolation layer separated from the first isolation layer by a third isolation layer, wherein the second isolation layer is in contact with the source/drain region.

12. The method of claim 11, wherein the first isolation layer is under inner spacers that are adjacent to the gate region.

13. The method of claim 11, wherein the second isolation layer is under the source/drain region.

14. The method of claim 11, wherein the third isolation layer is under the source/drain region.

15. The method of claim 11, wherein the third isolation layer comprises inner spacer material and is formed on a sidewall of the first isolation layer, inner spacers being formed adjacent to the epitaxial region and comprising the inner spacer material.

16. The method of claim 11, wherein the third isolation layer comprises a different width than an inner spacer.

17. The method of claim 11, wherein the third isolation layer extends from an inner spacer.

18. The method of claim 11, wherein the first and second isolation layers comprise different thicknesses.

19. The method of claim 11, wherein the first and second isolation layers comprise different materials.

20. The method of claim 11, wherein the third isolation layer is adjacent to the first isolation layer, the second isolation layer, and the epitaxial region.

21. A semiconductor structure comprising:
a transistor comprising a gate region and a source/drain region, a backside contact being adjacent to the source/drain region, wherein inner spacers are adjacent to the gate region; and
an isolation layer under the gate region and separated from the backside contact by another isolation layer, wherein the another isolation layer is under the source/drain region, wherein the another isolation layer is in contact with both a sidewall of the inner spacers and a sidewall of the backside contact.

22. The semiconductor structure of claim 21, wherein the isolation layer is under inner spacers that are adjacent to the gate region.

23. The semiconductor structure of claim 21, wherein the another isolation layer comprises inner spacer material and is formed on a sidewall of the isolation layer, the inner spacers being formed adjacent to the source/drain region and comprising the inner spacer material.

24. A method comprising:
forming a transistor comprising a gate region and a source/drain region, a backside contact being adjacent to the source/drain region, wherein inner spacers are adjacent to the gate region; and
providing an isolation layer under the gate region and separated from the backside contact by another isolation layer, wherein the another isolation layer is under the source/drain region, wherein the another isolation layer is in contact with both a sidewall of the inner spacers and a sidewall of the backside contact.

* * * * *